United States Patent
Zhao et al.

(10) Patent No.: US 10,872,578 B2
(45) Date of Patent: Dec. 22, 2020

(54) SHIFT REGISTER UNIT, GATE DRIVING CIRCUIT AND DRIVING METHOD THEREOF

(71) Applicants: BOE Technology Group Co., Ltd., Beijing (CN); Hefei Xinsheng Optoelectronics Technology Co., Ltd., Hefei (CN)

(72) Inventors: Jian Zhao, Beijing (CN); Hui Wang, Beijing (CN)

(73) Assignees: BOE Technology Group Co., Ltd., Beijing (CN); Hefei Xinsheng Optoelectronics Technology Co., Ltd., Anhui (CN)

(*) Notice: Subject to any disclaimer, the term of this patent is extended or adjusted under 35 U.S.C. 154(b) by 224 days.

(21) Appl. No.: 15/766,659

(22) PCT Filed: Sep. 30, 2017

(86) PCT No.: PCT/CN2017/104812
§ 371 (c)(1),
(2) Date: Apr. 6, 2018

(87) PCT Pub. No.: WO2018/188285
PCT Pub. Date: Oct. 18, 2018

(65) Prior Publication Data
US 2019/0066617 A1   Feb. 28, 2019

(30) Foreign Application Priority Data
Apr. 12, 2017   (CN) .......................... 2017 1 0237626

(51) Int. Cl.
*G11C 19/00*   (2006.01)
*G09G 3/36*   (2006.01)
(Continued)

(52) U.S. Cl.
CPC ............. *G09G 3/3677* (2013.01); *G09G 3/20* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 6,300,930 B1   10/2001   Mori
2011/0058640 A1*   3/2011   Shang ................. G11C 19/184
377/64
(Continued)

FOREIGN PATENT DOCUMENTS

CN   102012591 A   4/2011
CN   103915052 A   7/2014
(Continued)

OTHER PUBLICATIONS

Jan. 16, 2018—(WO) International Search Report and Written Opinion Appn PCT/CN2017/104812 with English Tran.
(Continued)

*Primary Examiner* — Tuan T Lam

(57) ABSTRACT

A shift register unit and a driving method thereof, a gate driving circuit, and an array substrate are provided, and the shift register unit includes: an input sub-circuit connected between a signal input terminal and a pull-up node, an output sub-circuit connected between the pull-up node and a signal output terminal; a reset sub-circuit connected between a reset terminal, the pull-up node and the signal output terminal; and a clock signal selection sub-circuit having input terminals connected to a first clock signal terminal and a second clock signal terminal, and a first output terminal connected to the output sub-circuit, and for
(Continued)

selecting to provide either a first clock signal or a second clock signal to the output sub-circuit according to voltage levels at the first control terminal and the second control terminal.

17 Claims, 7 Drawing Sheets

(51) Int. Cl.
    *G11C 19/28*     (2006.01)
    *G09G 3/20*     (2006.01)
    *H04N 13/359*     (2018.01)

(52) U.S. Cl.
    CPC ............ *G09G 2310/0267* (2013.01); *G09G 2310/0286* (2013.01); *G09G 2320/0209* (2013.01); *G09G 2320/0252* (2013.01); *H04N 13/359* (2018.05)

(56) References Cited

U.S. PATENT DOCUMENTS

| | | | |
|---|---|---|---|
| 2011/0193836 A1 | 8/2011 | Umezaki | |
| 2014/0159999 A1* | 6/2014 | Gu .................... | G11C 19/28 345/100 |
| 2014/0219412 A1 | 8/2014 | Chien et al. | |
| 2015/0043703 A1* | 2/2015 | Tan .................... | G11C 19/28 377/68 |
| 2015/0318051 A1* | 11/2015 | Hong .................. | G11C 19/28 377/68 |
| 2015/0332784 A1* | 11/2015 | Yan .................... | G09G 3/3611 377/64 |
| 2015/0371716 A1 | 12/2015 | Shao et al. | |
| 2016/0012764 A1* | 1/2016 | Xu ..................... | G11C 19/28 345/204 |
| 2016/0027526 A1* | 1/2016 | Xu ..................... | G11C 19/28 345/215 |
| 2016/0240158 A1* | 8/2016 | Xu ..................... | G11C 19/28 |
| 2016/0351156 A1* | 12/2016 | Wu .................... | G11C 19/28 |
| 2017/0162149 A1 | 6/2017 | Zhao et al. | |
| 2018/0218682 A1* | 8/2018 | Li ...................... | G09G 3/3258 |
| 2018/0268814 A1* | 9/2018 | SaganeGowda ...... | G10L 15/063 |
| 2019/0005866 A1* | 1/2019 | Li ...................... | G09G 3/20 |
| 2019/0057635 A1* | 2/2019 | Zhang ................ | G09G 3/20 |

FOREIGN PATENT DOCUMENTS

| | | |
|---|---|---|
| CN | 103928005 A | 7/2014 |
| CN | 104078017 A | 10/2014 |
| CN | 105047120 A | 11/2015 |
| CN | 105096861 A | 11/2015 |
| CN | 105741808 A | 7/2016 |
| CN | 105938711 A | 9/2016 |
| CN | 106875911 A | 6/2017 |
| JP | H11194314 A | 7/1999 |
| KR | 1020090110750 A | 10/2009 |
| TW | 201433091 A | 8/2014 |

OTHER PUBLICATIONS

Oct. 9, 2018—(CN) First Office Action Appn 201710237626.8 with English Translation.

* cited by examiner

SHIFT REGISTER UNIT, GATE DRIVING CIRCUIT AND DRIVING METHOD THEREOF

The application is a U.S. National Phase Entry of International Application No. PCT/CN2017/104812 filed on Sep. 30, 2017, designating the United States of America and claiming priority to Chinese Patent Application No. 201710237626.8 filed on Apr. 12, 2017. The present application claims priority to and the benefit of the above-identified applications and the above-identified applications are incorporated by reference herein in their entirety.

TECHNICAL FIELD

The present disclosure relates to the field of display technology, and more particularly to a shift register unit, a gate driving circuit comprising a plurality of stages of the shift register unit and a driving method thereof.

BACKGROUND

During displaying of a liquid crystal display panel including a pixel array, a gate driving circuit is used to generate gate line voltages for driving pixels on the display panel. The gate driving circuit outputs the gate line voltages and progressively scans respective pixels. In recent years, with continuous development of the amorphous silicon thin film technique, a gate driving circuit can be directly integrated on a thin film transistor array substrate to constitute GOA (Gate driver On Array) so as to drive the gate lines. When adopting GOA for driving, the GOA unit can be directly fabricated on the liquid crystal display panel, thus simplifying the manufacturing process, reducing the product cost, and facilitating the realization of a narrow bezel.

Generally, GOA comprising a plurality of stages of shift register units can be used to provide switching signals for the gate lines in respective rows of the pixel array, thereby controlling a plurality of rows of gate lines to be turned on sequentially, and the display data signals are inputted by data lines to pixels in the corresponding rows in the pixel array, thus forming grayscale voltages required for displaying respective grayscales of an image, so as to display each frame of image.

At present, 3D (Three-Dimensional) displaying is increasingly favored by consumers in the market. As a mainstream 3D display technology, 3D shutter-type display technology has been widely accepted by the market due to such advantages as higher resolution, lower cost and better stereoscopic effect. However, 3D shutter-type display technology has certain drawbacks, such as being affected by response time of liquid crystal, a crosstalk phenomenon (a previous frame of image remains to a next frame, resulting in ghost). In order to solve the crosstalk problem, black insertion technique is generally adopted between left and right eye signals to reduce crosstalk. Because 3D shutter-type display technology is to receive signals alternately between the left and right eyes, it has higher requirement for frame rate, for example, 120 Hz is typically required. After the black insertion technique is adopted, the frame rate needs to be doubled or raised much higher. However, adopting high-frequency driving has great influence on charge saturation of the liquid crystal panel and requires significant changes to the gate integrated circuit, increasing the design difficulty and system complexity.

SUMMARY

To this end, the present disclosure provides a shift register unit, a gate driving circuit comprising a plurality of stages of the shift register unit and a driving method thereof.

According to an aspect of the present disclosure, there is provided a shift register unit, comprising: an input sub-circuit connected between a signal input terminal and a pull-up node, and configured to input a signal to the pull-up node; an output sub-circuit connected between the pull-up node and a signal output terminal, and configured to output a pulse signal to the signal output terminal under control of the pull-up node; a reset sub-circuit connected between a reset terminal, the pull-up node and the signal output terminal, and configured to reset the pull-up node and the signal output terminal under control of the reset terminal; and a clock signal selection sub-circuit, input terminals of the clock signal selection sub-circuit being connected to a first clock signal terminal and a second clock signal terminal, and a first output terminal of the clock signal selection sub-circuit being connected to the output sub-circuit, and the clock signal selection sub-circuit being configured to select to provide either a first clock signal or a second clock signal to the output sub-circuit according to voltage levels at the first control terminal and the second control terminal.

According to another aspect of the present disclosure, there is provided a gate driving circuit, comprising N stages of the shift register unit as described above, wherein the shift register unit in a k-th stage is configured to scan a corresponding gate line, and a signal output terminal of the shift register unit in the k-th stage is connected to a signal input terminal of the shift register unit in an (k+1)-th stage via a first switching transistor corresponding to the k-th stage and also connected to a signal input terminal of the shift register unit in a (k+2)-th stage via a second switching transistor corresponding to the k-th stage, where k≥3; a signal input terminal of the shift register unit in the k-th stage is connected to a signal output terminal of the shift register unit in a (k−1)-th stage via a third switching transistor corresponding to the k-th stage and also connected to an output terminal of the shift register unit in a (k−2)-th via a fourth switching transistor corresponding to the k-th stage.

According to yet another aspect of the present disclosure, there is provided a method applied to the gate driving circuit as described above, comprising: in a 2D display mode, inputting a second voltage level to a first switching control line and inputting a first voltage level to a second switching control line, thereby turning on a first switching transistor disposed between two stages of GOA units that are immediately adjacent and turning off a second switching transistor disposed between two stages of GOA units that are spaced by one stage; inputting a second voltage level to a first control line and a third control line, and inputting a first voltage level to a second control line and a fourth control line, so that clock signals to be selected and output by two stages of GOA units that are immediately adjacent are a first clock signal and a second clock signal, respectively; inputting a frame start signal to a signal input terminal of a dummy shift register unit in a first stage, and inputting a first clock signal and a second clock signal to a first clock signal terminal and a second clock signal terminal of the dummy shift register unit in the first stage, respectively, so that scanning shift register units in respective stages sequentially output driving signals to gate lines connected thereto.

Optionally, the above method further comprises: in a 3D display mode, inputting a first voltage level to a first switching control line and inputting a second voltage level to a second switching control line, thereby turning off a first switching transistor disposed between two stages of GOA units that are immediately adjacent and turning on a second switching transistor disposed between two stages of GOA units that are spaced by one stage; inputting a second voltage level to a first control line and a fourth control line, and inputting a first voltage level to a second control line and a third control line; inputting a frame start signal to a signal input terminal of the dummy shift register unit in first and second stages, and inputting a first clock signal and a second clock signal to a first clock signal terminal and a second clock signal terminal of the dummy shift register unit in the first stage, respectively, so that timings of the signals received at the signal input terminals of every two stages of shift register units that are immediately adjacent are the same, and timings of the signals outputted therefrom are the same. Optionally, the first voltage level is a low voltage level, the second voltage level is a high voltage level.

In the shift register unit, the gate driving circuit and the driving method thereof provided according to the present disclosure, switching transistors are disposed between shift register units in respective stages, and the respective switching transistors are controlled by corresponding control lines, so that connection manners of the shift register units in respective stages can be changed between the 2D display mode and the 3D display mode, and thereby the display panel can be switched freely between two different display modes of 2D and 3D, and dual gate lines can be scanned simultaneously during the 3D display, reducing the scanning frequency, decreasing the impact caused by high-frequency scanning signals on charging of the display panel, without additional design, reducing the product cost significantly.

BRIEF DESCRIPTION OF THE DRAWINGS

In order to more clearly explain the technical solutions of the embodiments of the present disclosure, the drawings necessary for description of the embodiments will be briefly described below. It is obvious that the drawings in the following description merely illustrate some embodiments of the present disclosure, rather than intended to make limit to the present disclosure.

DETAILED DESCRIPTION OF THE EMBODIMENTS

Hereinafter, the technical solutions in the embodiments of the present disclosure will be described clearly and comprehensively in combination with the drawings in the embodiments of the present disclosure, obviously, these described embodiments are only parts of the embodiments of the present disclosure, rather than all of the embodiments thereof. All the other embodiments obtained by those of ordinary skill in the art based on the embodiments of the present disclosure without paying creative efforts fall into the protection scope of the present disclosure.

Figure 1:
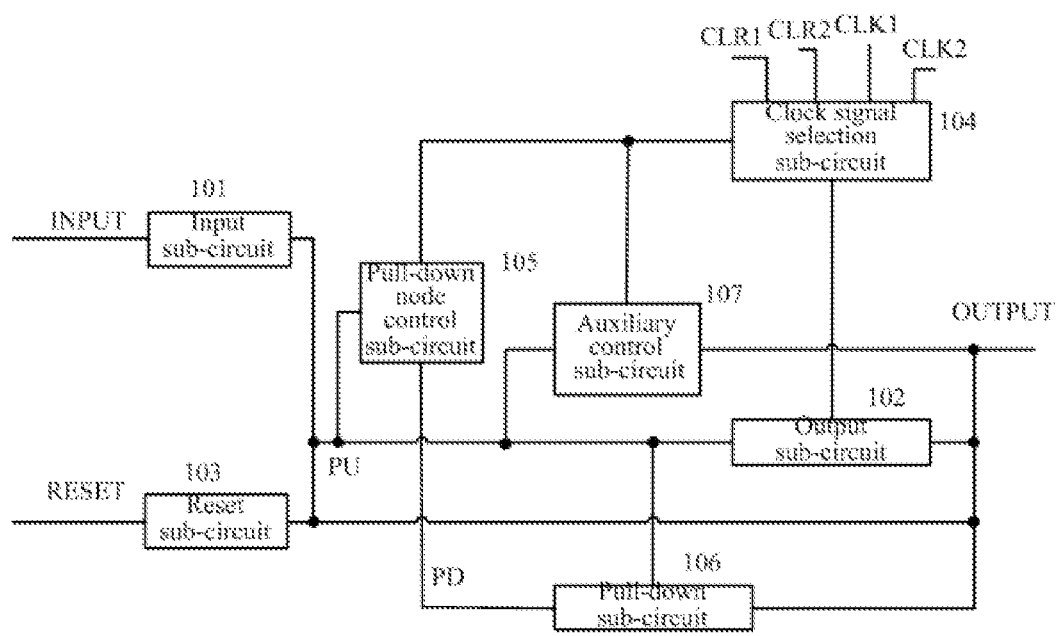
FIG. 1 illustrates a block diagram of a shift register unit according to an embodiment of the present disclosure.

FIG. 1 illustrates a block diagram of a shift register unit according to an embodiment of the present disclosure. As illustrated in FIG. 1, the shift register unit comprises: an input sub-circuit 101 connected between a signal input terminal INPUT and a pull-up node PU, and configured to input a signal to the pull-up node PU; an output sub-circuit 102 connected between the pull-up node PU and a signal output terminal OUTPUT, and configured to output a pulse signal to the signal output terminal OUTPUT under control of the pull-up node PU; a reset sub-circuit 103 connected between a reset terminal RESET, the pull-up node PU and the signal output terminal OUTPUT, and configured to reset the pull-up node PU and the signal output terminal OUTPUT under control of the reset terminal RESET; and a clock signal selection sub-circuit 104 having input terminals connected to a first clock signal terminal CLK1 and a second clock signal terminal CLK2, and a first output terminal connected to the output sub-circuit 102, and configured to select to provide either a first clock signal or a second clock signal to the output sub-circuit 102 according to voltage levels at the first control terminal and the second control terminal.

Optionally, the shift register unit according to the present disclosure, as illustrated in FIG. 1, further comprises: a pull-down node control sub-circuit 105 connected to the pull-up node PU and a second output terminal of the clock signal selection sub-circuit 104, and configured to control a voltage level at the pull-down node according to the first clock signal or the second clock signal provided by the clock signal selection sub-circuit and the voltage level at the pull-up node PU.

Optionally, the shift register unit according to the present disclosure, as illustrated in FIG. 1, further comprises: a pull-down sub-circuit 106 connected to the pull-down node, the pull-up node and the signal output terminal, and configured to pull down the pull-up node and the signal output terminal according to the voltage level at the pull-down node.

Optionally, the shift register unit according to the present disclosure, as illustrated in FIG. 1, further comprises: an auxiliary control sub-circuit 107 connected to the pull-up node PU, the signal output terminal and the second output terminal of the clock signal selection sub-circuit 104, and configured to assist in controlling voltage levels at the pull-up node and the signal output terminal according to a clock signal provided by the clock signal selection sub-circuit.

The shift register unit according to an embodiment of the present disclosure can select the clock signal to be provided to the output sub-circuit through the clock signal selection sub-circuit, so as to output the corresponding pulse signal at the signal output terminal.

In addition, the shift register unit according to an embodiment of the present disclosure can select the clock signal to be provided to the pull-down node control sub-circuit and the auxiliary control sub-circuit through the clock signal selection sub-circuit, so as to control voltage levels at the pull-down node, the pull-up node and the signal output terminal.

Figure 2:
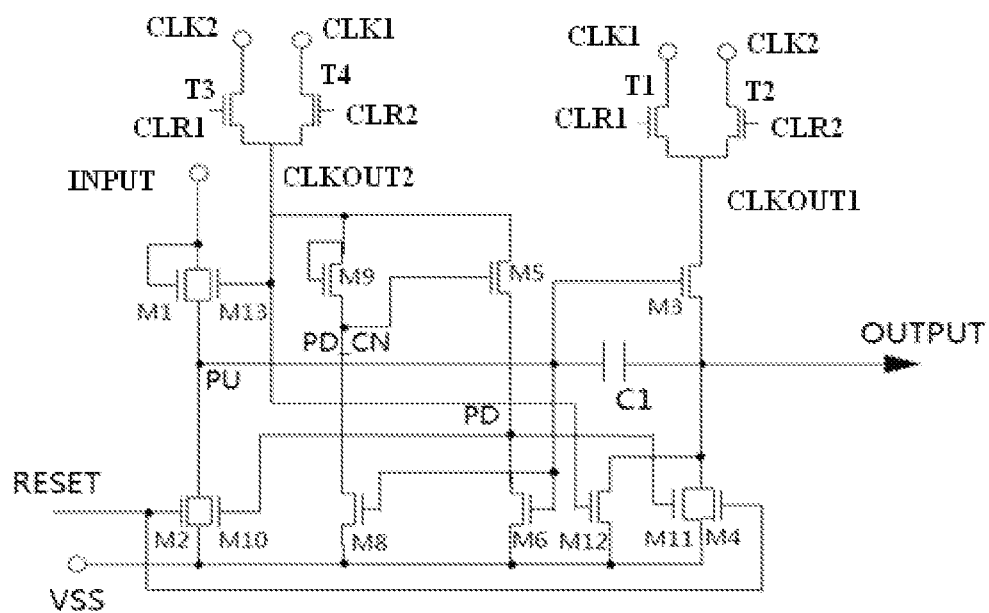
FIG. 2 illustrates a specific circuit structure of a shift register unit according to an embodiment of the present disclosure.

FIG. 2 illustrates a specific circuit structure of a shift register unit according to an embodiment of the present disclosure. As illustrated in FIG. 2, optionally, the input sub-circuit comprises: an input transistor M1, a control electrode and a first electrode of the input transistor being connected to the signal input terminal, and a second electrode of the input transistor being connected to the pull-up node.

Optionally, as illustrated in FIG. 2, the output sub-circuit comprises: an output transistor M3, a control electrode of the output transistor being connected to the pull-up node, a first electrode of the output transistor being connected to the first output terminal CLKOUT1 of the clock signal selection sub-circuit, a second electrode of the output transistor being connected to the signal output terminal OUTPUT; and a capacitor C1, a first terminal of the capacitor being connected to the pull-up node PU, and a second terminal of the capacitor being connected to the signal output terminal OUTPUT.

Optionally, as illustrated in FIG. 2, the reset sub-circuit 103 comprises: a first reset transistor M2, a control electrode of the first reset transistor being connected to the reset terminal RESET, a first electrode of the first reset transistor being connected to the pull-up node PU, and a second electrode of the first reset transistor being connected to a first power supply terminal VSS; and a second reset transistor M4, a control electrode of the second reset transistor being connected to the reset terminal RESET, a first electrode of the second reset transistor being connected to the signal output terminal OUTPUT, and a second electrode of the second reset transistor being connected to the first power supply terminal VSS.

Optionally, as illustrated in FIG. 2, the clock signal selection sub-circuit comprises: a first selection transistor T1, a control electrode of the first selection transistor being connected to the first control terminal CLR1, a first electrode of the first selection transistor being connected to the first clock signal terminal CLK1, and a second electrode of the first selection transistor being connected to the first output terminal CLKOUT1 of the clock signal selection sub-circuit; and a second selection transistor T2, a control electrode of the second selection transistor being connected to the second control terminal CLR2, a first electrode of the second selection transistor being connected to the second clock signal terminal CLK2, and a second electrode of the second selection transistor being connected to the second electrode of the first selection transistor T1.

Optionally, as illustrated in FIG. 2, the clock signal selection sub-circuit further comprises: a third selection transistor T3, a control electrode of the third selection transistor being connected to the first control terminal CLR1, a first electrode of the third selection transistor being connected to the second clock signal terminal CLK2, and a second electrode of the third selection transistor being connected to the second output terminal CLKOUT2 of the clock signal selection sub-circuit; and a fourth selection transistor T4, a control electrode of the fourth selection transistor being connected to the second control terminal CLR2, a first electrode of the fourth selection transistor being connected to the first clock signal terminal CLK1, and a second electrode of the fourth selection transistor being connected to the second electrode of the third selection transistor T3.

Optionally, as illustrated in FIG. 2, the pull-down node control sub-circuit comprises: a first pull-down control transistor M9, a control electrode and a first electrode of the first pull-down control transistor being connected to the second output terminal CLKOUT2 of the clock signal selection sub-circuit, and a second electrode of the first pull-down control transistor being connected to a pull-down control node PD_CN; a second pull-down control transistor M5, a control electrode of the second pull-down control transistor being connected to the pull-down control node PD_CN, a first electrode of the second pull-down control transistor being connected to the first electrode of the first pull-down control transistor M9, and a second electrode of the second pull-down control transistor being connected to the pull-down node PD; and a third pull-down control transistor M8, a control electrode of the third pull-down control transistor being connected to the pull-up node PU, a first electrode of the third pull-down control transistor being connected to the pull-down control node PD_CN, a second electrode of the third pull-down control transistor being connected to the first power supply terminal VSS; and a fourth pull-down control transistor M6, a control electrode of the fourth pull-down control transistor being connected to the pull-up node PU, a first electrode of the fourth pull-down control transistor being connected to the pull-down node PD, and a second electrode of the fourth pull-down control transistor being connected to the first power supply terminal VSS.

Optionally, as illustrated in FIG. 2, the pull-down sub-circuit comprises: a first pull-down transistor M10, a control electrode of the first pull-down transistor being connected to the pull-down node PD, a first electrode of the first pull-down transistor being connected to the pull-up node PU, a second electrode of the first pull-down transistor being connected to the first power supply terminal VSS; and a second pull-down transistor M11, a control electrode of the second pull-down transistor being connected to the pull-down node PD, a first electrode of the second pull-down transistor being connected to the signal output terminal OUTPUT, and a second electrode of the second pull-down transistor being connected to the first power supply terminal VSS.

Optionally, as illustrated in FIG. 2, the auxiliary control sub-circuit 107 comprises: a first auxiliary control transistor M13, a control electrode of the first auxiliary control transistor being connected to the second output terminal CLKOUT2 of the clock signal selection sub-circuit, a first electrode of the first auxiliary control transistor being connected to the signal input terminal INPUT, and a second electrode of the first auxiliary control transistor being connected to the pull-up node PU; and a second auxiliary control transistor M12, a control electrode of the second auxiliary control transistor being connected to the second output terminal CLKOUT2 of the clock signal selection sub-circuit, a first electrode of the second auxiliary control transistor being connected to the signal output terminal OUTPUT, and a second electrode of the second auxiliary control transistor being connected to the first power supply terminal VSS.

Optionally, in the shift register unit described above, each of the above-mentioned transistors can be a TFT transistor, wherein the control electrode of the transistor is a gate, the first electrode is a drain, and the second electrode is a source. In addition, it should be understood that, since a source and a drain of the transistors adopted here are symmetrical, the source and the drain of these transistors can be interchanged. In the embodiments of the present disclosure, in order to distinguish the two electrodes other than the gate, one terminal is referred to as a source, and the other terminal is referred to as a drain. If a source is selected as a signal input terminal, then a drain serves as a signal output terminal, vice versa.

In addition, in FIG. 2, description is provided taking a case in which all the TFTs are P-type TFTs as an example. However, as will be appreciated, some or all of the transistors can also be N-type TFTs, as long as control voltage levels at the gates thereof and the power supply voltages provided thereto are adjusted accordingly, such implementations are also within the protection scope of the present disclosure.

In addition, although the first power supply terminal is illustrated as being inputted with the low voltage level VSS in FIG. 2, in order to implement the principle of the present disclosure, the first power supply terminal can be inputted with different low voltage levels, for example, low voltage levels VSS and VGL with different voltage values. For example, a low voltage level connected with the transistor for pulling down the output terminal of the shift register unit can be the low voltage level VGL, whereas a low voltage level connected with the transistor for pulling down the pull-up node of the shift register unit can be the low voltage level VSS, wherein the voltage level of VGL is lower than the voltage level of VSS. In this way, a gate-source potential of the output transistor of the shift register unit can be reversely biased when the pull-up node and the output terminal are both pulled down to low voltage levels, and even if the output transistor is a depletion transistor, it can be guaranteed that the output transistor is completely turned off.

Figure 3:
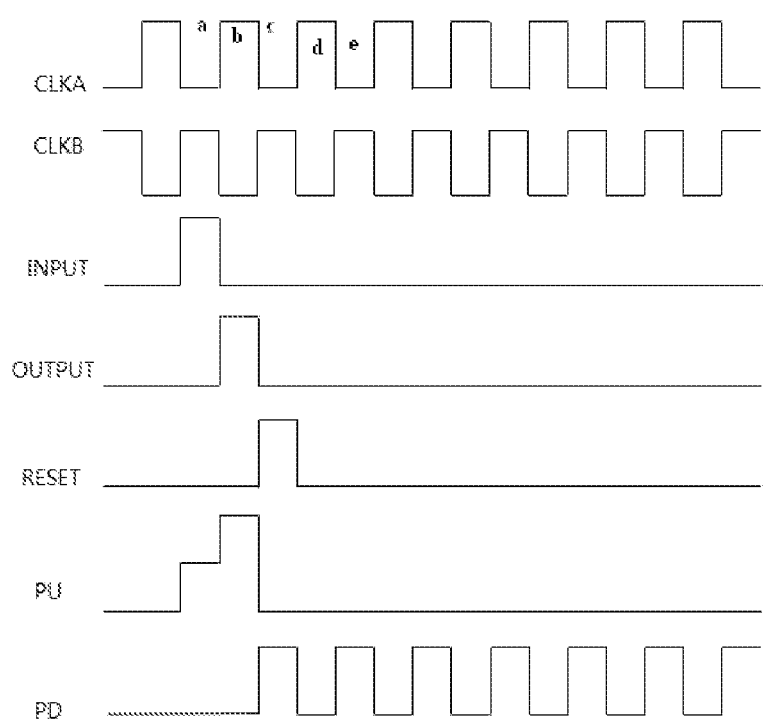
FIG. 3 illustrates a signal timing that can be applied to the shift register unit illustrated in FIG. 2 according to an embodiment of the present disclosure.

Next, the operating principle of the shift register unit illustrated in FIG. 2 will be briefly described with reference to the signal timing illustrated in FIG. 3. Herein, with the first control terminal CLR1 being at a high voltage level and the second control terminal CLR2 being at a low voltage level as an example, operations of the shift register unit in the five periods a, b, c, d and e in the timing diagram illustrated in FIG. 3 are described.

Since the first control terminal CLR1 is at a high voltage level and the second control terminal CLR2 is at a low voltage level, the first selection transistor T1 and the third selection transistor T3 in the clock signal selection sub-circuit are turned on, and the second selection transistor T2 and the fourth selection transistor T4 are turned off, so as to provide the first clock signal CLKA to the first output terminal of the clock signal selection sub-circuit and provide the second clock signal CLKB to the second output terminal of the clock signal selection sub-circuit. Cycles of the first clock signal CLKA and the second clock signal CLKB are equal, their duty ratios both are 50%, and their phases have a difference of 180 degrees.

In the first period a, the input signal inputted at the signal input terminal INPUT is at a high voltage level, the first clock signal CLKA is at a low voltage level, and the second clock signal CLKB is at a high voltage level; the transistor M1 is turned on, enabling the input signal of a high voltage level to charge the pull-up node PU; since the second clock signal CLKB is at a high voltage level, the transistor M13 is turned on, so as to accelerate the charging process of the pull-up node PU; thus, the pull-up node PU is charged to the first high voltage level, the output transistor M3 is turned on, and the clock signal CLKA of a low voltage level is outputted to the signal output terminal; the transistor M9 is turned on to charge the pull-down control node PD_CN, however, since the pull-up node PU is at a first high voltage level, the transistors M6 and M8 are turned on; in design of transistors, a size ratio of the transistors M8 and M9 can be configured so that the voltage level at the pull-down control node PD_CN is pulled down to a low voltage level when M9 and M8 are both turned on; in this case, PD_CN is at a low voltage level, the transistor M5 remains turned-off; since the transistor M6 is turned on, the voltage level at the pull-down node PD is pulled down to a low voltage level, and thus the transistors M10 and M11 are in a turned-off state in this period; since the CLKB is at a high voltage level, the transistor M12 is turned on, which can ensure that the output terminal of the shift register unit is pulled down to a low voltage level VSS;

In the second period b, the first clock signal CLKA is at a high voltage level, the second clock signal CLKB is at a low voltage level, the signal inputted at the signal input terminal INPUT is at a low voltage level; the transistors M1, M13, M9, M5 and M12 are turned off; the output transistor M3 remains turned-on, and the clock signal CLKA of a high voltage level is outputted as a pulse signal; due to bootstrap effect of the storage capacitor C1, the voltage level at the pull-up node PU further rises to a second high voltage level, enabling the output transistor M3 to be turned on more fully; since the voltage level at the pull-up node PU is raised relative to the voltage level in the period a, the transistors M8 and M6 are turned on more fully to further pull down the pull-down control node PD_CN and the pull-down node PD, respectively; since the pull-down node PD is at a low voltage level, the transistors M10 and M11 remain turned-off, so as not to affect the shift register unit to output the pulse signal;

In the third period c, the first clock signal CLKA is at a low voltage level, the second clock signal CLKB is at a high voltage level, the signal input terminal INPUT continues to be inputted with a low voltage level, and the reset terminal RESET is inputted with a high voltage level; since the reset terminal is inputted with a high voltage level, the transistors M2 and M4 are turned on, so as to pull down the pull-up node PU and the output terminal of the shift register unit to a low voltage level VSS; the transistor M1 is turned off, the transistor M13 is turned on, a low voltage level is inputted to the pull-up node PU, so as to discharge the pull-up node PU; the pull-up node PU is discharged to a low voltage level, so that the transistor M3 is turned off; since the second clock signal CLKB is at a high voltage level, the transistor M12 is turned on, and the output terminal of the shift register unit is pulled down to a low voltage level VSS; the transistor M9 is turned on to charge the pull-down control node PD_CN, which in turn causes the transistor M5 to be turned on, thereby charging the pull-down node PD; since the pull-up node PU is at a low voltage level, the transistors M6 and M8 are turned off; the pull-down node PD is charged to a high voltage level, the transistors M10 and M11 are turned on, so as to pull down the pull-up node PU and the output terminal of the shift register unit to a low voltage level VSS, respectively;

In the fourth period d, the first clock signal CLKA is at a high voltage level, the second clock signal CLKB is at a low voltage level, the signal input terminal INPUT continues to be inputted with a low voltage level, and the reset terminal is inputted with a low voltage level; the transistors M1, M13, M2, M4, M9 and M12 are turned off; since the pull-up node PU remains at a low voltage level, the transistors M6 and M8 maintain turned-off; since the transistors M8 and M9 are both turned off, a discharge path of the pull-down control node PD_CN is cut off, the pull-down control node PD_CN maintains the previous high voltage level, so that the transistor M5 remains turned-on; since the second clock signal CLKB is at a low voltage level, the pull-down node PD is discharged.

In the fifth period e, the first clock signal CLK is at a low voltage level, the second clock signal CLKB is at a high voltage level, the input terminal INPUT continues to be inputted with a low voltage level, and the reset terminal is inputted with a low voltage level; the transistors M1, M2 and M4 are turned off; the transistor M13 is turned on, and the low voltage level is inputted to the pull-up node PU, so as to discharge the pull-up node PU, thereby ensuring that the transistor M3 is turned off; CLKB is at a high voltage level, and the transistor M12 is turned on, so as to pull down the output terminal of the shift register unit to a low voltage level VSS, thus eliminating the noise at the output terminal of the shift register unit; the transistor M9 is turned on to charge the pull-down control node PD_CN, so that the transistor M5 is turned on more fully, and the pull-down node PD is charged, causing the pull-down node PD to change into a high voltage level; since the pull-up node PU is discharged, the transistors M6 and M8 remain turned-off; the high voltage level at the pull-down node PD causes the transistors M10 and M11 to be turned on, thus pulling down the pull-up node PU and the output terminal of the shift register unit to a low voltage level VSS, respectively, which eliminates the noise formed at the pull-up node and the output terminal.

Thereafter, the shift register unit repeats the operations in periods d and e until a next active input signal arrives.

Although the operating principle of the shift register unit illustrated in FIG. 2 is described above with the first control terminal CLR1 being at a high voltage level and the second control terminal CLR2 being at a low voltage level as an example, based on the above principle, the case in which the first control terminal CLR1 is at a low voltage level and the second control terminal CLR2 is at a high voltage level is similar, details are not repeated herein.

Figure 4:
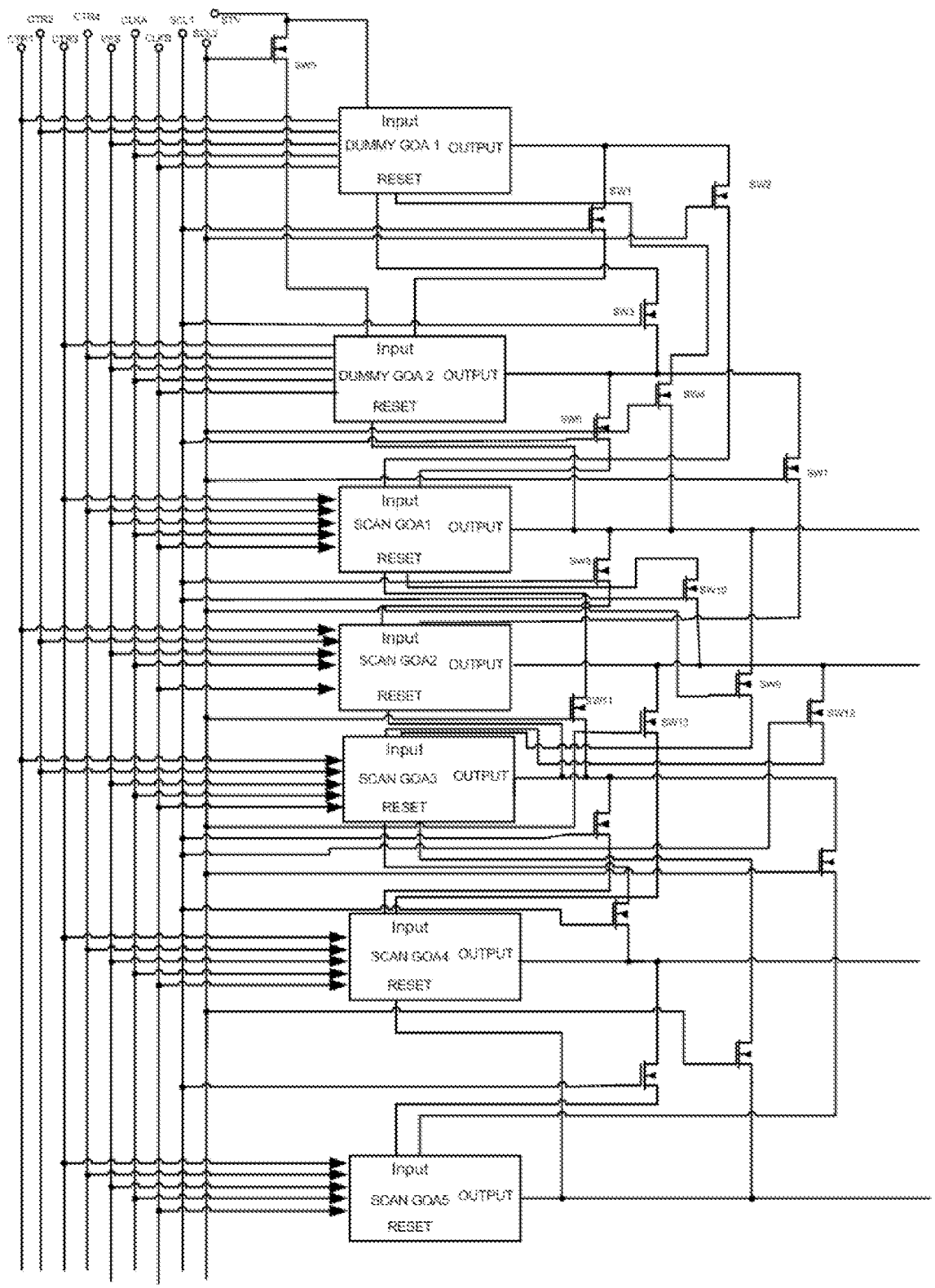
FIG. 4 illustrates a schematic structure of a gate driving circuit including a plurality of stages of the shift register units according to an embodiment of the present disclosure.

According to an embodiment of the present disclosure, there is provided a gate driving circuit comprising a plurality of stages of the shift register units (GOA unit) described above. FIG. 4 illustrates a schematic structure of the gate driving circuit. As illustrated in FIG. 4, the gate driving circuit comprises a plurality of GOA units, wherein the plurality of GOA units are divided into roughly four types, i.e., Dummy GOA 1 in a first stage, Dummy GOA 2 in a second stage, Scanning GOA 2N+1 (N≥0, N is an integer) in an odd-numbered stage, and Scanning GOA 2N+2 (N≥0, N is an integer) in an even-numbered stage, wherein internal structure of each GOA unit is as illustrated in FIG. 2, wherein it comprises sixteen TFTs and one capacitor.

Specifically, Dummy GOA 1 and Dummy GOA 2 are mainly responsible for signal activation, and serve for signal activation of the subsequent GOA units, and do not responsible for providing gate line scanning control in the active area on the display panel.

As illustrated in FIG. 4, a signal input terminal INPUT of Dummy GOA 1 is inputted with a STV signal, and a signal output terminal of Dummy GOA 1 is connected to a signal input terminal of Dummy GOA 2 via a first switching transistor SW1 corresponding to Dummy GOA 1 and connected to a signal input terminal of Scanning GOA 1 in a first stage via a second switching transistor SW2 corresponding to Dummy GOA 1; a reset terminal of Dummy GOA 1 is connected to a signal output terminal of Dummy GOA 2 via a third switching transistor SW3 corresponding to Dummy GOA 1 and connected to a signal output terminal of Scanning GOA 1 in the first stage via a fourth switching transistor SW4 corresponding to Dummy GOA 1; a first control terminal of Dummy GOA 1 is connected to a first control line CTR1, and a second control terminal of Dummy GOA 1 is connected to a second control line CTR2, a control electrode of the first switching transistor SW1 is connected to a first switching control line SCL1, a control electrode of the second switching transistor SW2 is connected to a second switching control line SCL2, and a control electrode of the third switching transistor SW3 is connected to the first switching control line SCL1, a control electrode of the fourth switching transistor SW4 is connected to the second switching control line SCL2, the first clock signal terminal receives a first clock signal CLKA, and the second clock signal terminal receives a second clock signal CLKB.

A signal input terminal INPUT of Dummy GOA 2 is inputted with the STV signal via a fifth switching transistor SW5 corresponding to Dummy GOA 2, and a signal output terminal of Dummy GOA 2 is connected to a signal input terminal of Scanning GOA 1 in a first stage via a sixth switching transistor SW6 corresponding to Dummy GOA 2 and connected to a signal input terminal of Scanning GOA 2 in a second stage via a seventh switching transistor SW7 corresponding to Dummy GOA 2; a reset terminal of Dummy GOA 2 is directly connected to a signal output terminal of Scanning GOA 1 in the first stage; a first control terminal of Dummy GOA 2 is connected to a third control line CTR3, a second control terminal of Dummy GOA 2 is connected to a fourth control line CTR4, and a control electrode of the fifth switching transistor SW5 is connected to a second switching control line SCL2, a control electrode of the sixth switching transistor SW6 is connected to a first switching control line SCL1, a control electrode of the seventh switching transistor SW7 is connected to the second switching control line SCL2, the first clock signal terminal receives the second clock signal CLKB, and the second clock signal terminal receives the first clock signal CLKA.

As illustrated in FIG. 4, as for Scanning GOA 1 in the first stage, its signal output terminal is also connected to the corresponding gate line GL1 in addition to the reset terminals of Dummy GOA 1 and Dummy GOA 2, for providing a scanning signal to the gate line GL1, so as to drive the corresponding pixel sub-circuit on the display panel; in addition, the signal output terminal of Scanning GOA 1 in the first stage is also connected to a signal input terminal of Scanning GOA 2 in a second stage via an eighth switching transistor SW8 corresponding to Scanning GOA 1 in the first stage, and connected to a signal input terminal of Scanning GOA 3 in a third stage via a ninth switching transistor SW9 corresponding to Scanning GOA 1 in the first stage; a reset terminal of Scanning GOA 1 in the first stage is connected to a signal output terminal of Scanning GOA 2 in the second stage via a tenth switching transistor SW10 corresponding to Scan GOA 1 in the first stage, and connected to a signal output terminal of Scanning GOA 3 in the third stage via an eleventh switching transistor SW11 corresponding to Scanning GOA 1 in the first stage; a first control terminal of Scanning GOA 1 in the first stage is connected to the third control line CTR3, the second control terminal thereof is connected to the fourth control line CTR4, and a control electrode of the eighth switching transistor SW8 is connected to the first switching control line SCL1, a control electrode of the ninth switching transistor SW9 is connected to the second switching control line SCL2, a control electrode of the tenth switching transistor SW10 is connected to the first switching control line SCL1, and a control electrode of the eleventh switching transistor SW11 is connected to the second switching control line SCL2; the first clock signal terminal receives the first clock signal CLKA, and the second clock signal terminal receives the second clock signal CLKB.

As illustrated in FIG. 4, as for Scanning GOA 2 in the second stage, its signal output terminal is also connected to the corresponding gate line GL2 in addition to the reset terminal of Scanning GOA 1 in the first stage, for providing a scanning signal to the gate line GL2, so as to drive the corresponding pixel sub-circuit on the display panel; in addition, the signal output terminal of Scanning GOA 2 in the second stage is also connected to a signal input terminal of Scanning GOA 3 in a third stage via a twelfth switching transistor SW12 corresponding to Scanning GOA 2 in the second stage, and connected to a signal input terminal of Scanning GOA 4 in a fourth stage via a thirteenth switching transistor SW13 corresponding to Scanning GOA 2 in the second stage; a reset terminal of Scanning GOA 2 in the second stage is directly connected to a signal output terminal of Scanning GOA 3 in the third stage; a first control terminal of Scanning GOA 2 in the second stage is connected to the first control line CTR1, a second control terminal of Scanning GOA 2 in the second stage is connected to the second control line CTR2, a control electrode of the twelfth switching transistor SW12 is connected to the first switching control line SCL1, a control electrode of the thirteenth switching transistor SW13 is connected to the second switching control line SCL2; the first clock signal terminal receives the second clock signal CLKB, and the second clock signal terminal receives the first clock signal CLKA.

As can be seen, supply of the input signal of Dummy GOA 1 sub-circuit is only one, from the frame start signal STV; supply of the reset signal is two, from outputs of two subsequent stages of GOA, i.e., outputs of Dummy GOA 2 sub-circuit and Scanning GOA 1 sub-circuit in the first stage; supply of the input signal of Dummy GOA 2 sub-circuit is two, from the STV signal and output of the GOA unit in a previous stage (i.e. Dummy GOA 1 sub-circuit), and supply of the reset signal of Dummy GOA 2 sub-circuit is only one, i.e., from output of the GOA unit in a previous stage, i.e. output of Scanning GOA 1 sub-circuit in the first stage.

As for input signals of Scanning GOA units, for example, Scanning GOA 1 sub-circuit in the first stage and Scanning GOA 2 sub-circuit in the second stage illustrated in FIG. 4, supply of input signals is two, from outputs of two previous consecutive stages of GOA units; for example, the input signal of Scanning GOA 1 sub-circuit in the first stage is from outputs of Dummy GOA 1 sub-circuit and Dummy GOA 2 sub-circuit, and the input signal of Scanning GOA 2 sub-circuit in the second stage is from outputs of Dummy GOA 2 sub-circuit and Scanning GOA 1 sub-circuit in the first stage.

As for reset signals of Scanning GOA units, for example, supply of the reset signal of Scanning GOA 1 in the first stage illustrated in FIG. 4 is two, that is, outputs of two subsequent consecutive stages of GOA units, that is, outputs of GOA 2 and GOA 3; and supply of the reset signal of second Scanning GOA 2 is one, that is, output of the subsequent consecutive one stage of GOA unit, that is, output of GOA 3.

Supply of the input signal and the reset signal of the subsequent respective stages of GOA units can be analogized. For example, as for GOA K sub-circuit (K≥3, K is an odd number), supply of its input signal is outputs of two previous consecutive stages of GOA units, i.e. outputs of GOA K−1 sub-circuit and GOA K−2 sub-circuit; supply of its reset signal is outputs of two subsequent stages of GOA units, i.e., outputs of GOA K+1 and GOA K+2. As for GOA K' (K'≥4, K is an even number), supply of its input signal is outputs of two previous stages of GOA units, i.e., outputs of GOA K−1 and GOA K−2, and supply of its reset signal is output of a subsequent consecutive one stage of GOA unit, i.e., output of GOA K+1 sub-circuit. In addition, it should be noted that, as described above, the clock signals received at the first clock signal terminals and the second clock signal terminals of the clock signal selection sub-circuits in GOAs in the odd-numbered and even-numbered stages are alternately switched, for example, the first clock signal terminals of the clock signal selection sub-circuits in the GOAs in the odd-numbered stages receive the first clock signal CLKA, the second clock signal terminals of the clock signal selection sub-circuits in the GOAs in the odd-numbered stages receive the second clock signal CLKB, whereas the first clock signal terminals of the GOAs in the even-numbered stages receive the second clock signal CLKB, the second clock signal terminals of the GOAs in the even-numbered stages receive the first clock signal CLKA.

According to the above embodiment of the present disclosure, by means of arranging corresponding control lines in the GOA area and using a certain number of TFT switches, it is possible for the display panel to switch freely between different display modes of 2D and 3D. Meanwhile, dual gate lines can be simultaneously turned on in the 3D display, and the influence caused by high frequency on charging of the display panel can be reduced. No additional design is needed, thus reducing the cost significantly.

For this reason, in the gate driving circuit according to the above embodiment of the present disclosure, as illustrated in FIG. 4, the first control terminal of the clock signal selection sub-circuit in Dummy GOA 1 and Scanning GOA units, i.e., GOA 2, GOA 3, GOA 6, GOA 7, GOA 10, GOA 11 ... GOA 4N+2, GOA 4N+3 (N≥0, N is an integer) is connected to the first control line CTR1, and the second control terminal thereof is connected to the second control line CTR2; first control terminal of Dummy GOA 2 and Scanning GOA units, i.e., GOA 1, GOA 4, GOA 5, GOA 8, GOA 9, GOA 12, ... GOA 4N+1, GOA 4N+4 (N≥0, N is an integer) is connected to the third control line CTR3, and the second control terminal thereof is connected to the fourth control line CTR4.

According to the above embodiment, the gate driving circuit provided by the present disclosure comprises N stages of the shift register unit as illustrated in FIG. 2, wherein the shift register unit in a k-th stage is configured to scan a corresponding gate line, and a signal output terminal OUTPUT of the shift register unit in the k-th stage is connected to a signal input terminal INPUT of the shift register unit in an (k+1)-th stage via a first switching transistor corresponding to the k-th stage and further connected to a signal input terminal INPUT of the shift register unit in a (k+2)-th stage via a second switching transistor corresponding to the k-th stage, where k≥3, N and k are integers; a signal input terminal INPUT of the shift register unit in the k-th stage is connected to a signal output terminal OUTPUT of the shift register unit in a (k−1)-th stage via a third switching transistor corresponding to the k-th stage and also connected to an output terminal of the shift register unit in a (k−2)-th stage via a fourth switching transistor corresponding to the k-th stage.

Optionally, in the gate driving circuit described above, the shift register unit in a first stage and the shift register unit in a second stage are configured as dummy shift register units; a signal output terminal of the shift register unit in the first stage is connected to a signal input terminal of the shift register unit in the second stage via the first switching transistor corresponding to the first stage, and a signal input terminal of the shift register unit in the first stage receives a frame start signal STV; the signal input terminal of the shift register unit in the second stage also receives the frame start signal STV via the second switching transistor corresponding to the second stage.

Optionally, in the gate driving circuit described above, a reset terminal of the shift register unit in a (2j−1)-th stage is connected to a signal output terminal of the stage shift register unit in a 2j-th stage via a fifth switching transistor corresponding to the (2j−1)-th stage and also connected to a signal output terminal of the shift register unit in a (2j+1)-th stage via a sixth switching transistor corresponding to the (2j−1)-th stage; a reset terminal of the shift register unit in a 2j-th stage is connected to a signal output terminal of the shift register unit in the (2j+1)-th stage, where $1 \leq j \leq (N-1)/2$, and j is an integer.

In order to realize switching between different display modes of 2D and 3D in the display panel, and meanwhile ensure the dual gate lines are simultaneously turned on in the 3D display process, the control principle of GOA units in the odd-numbered stages in the gate driving circuit of the present embodiment is slightly different from that of GOA units in the even-numbered stages; hereinafter, the operating principle for the gate driving circuit according to an embodiment of the present disclosure to perform 2D display driving will be described in combination with the signal timing in FIG. 5.

Figure 5:
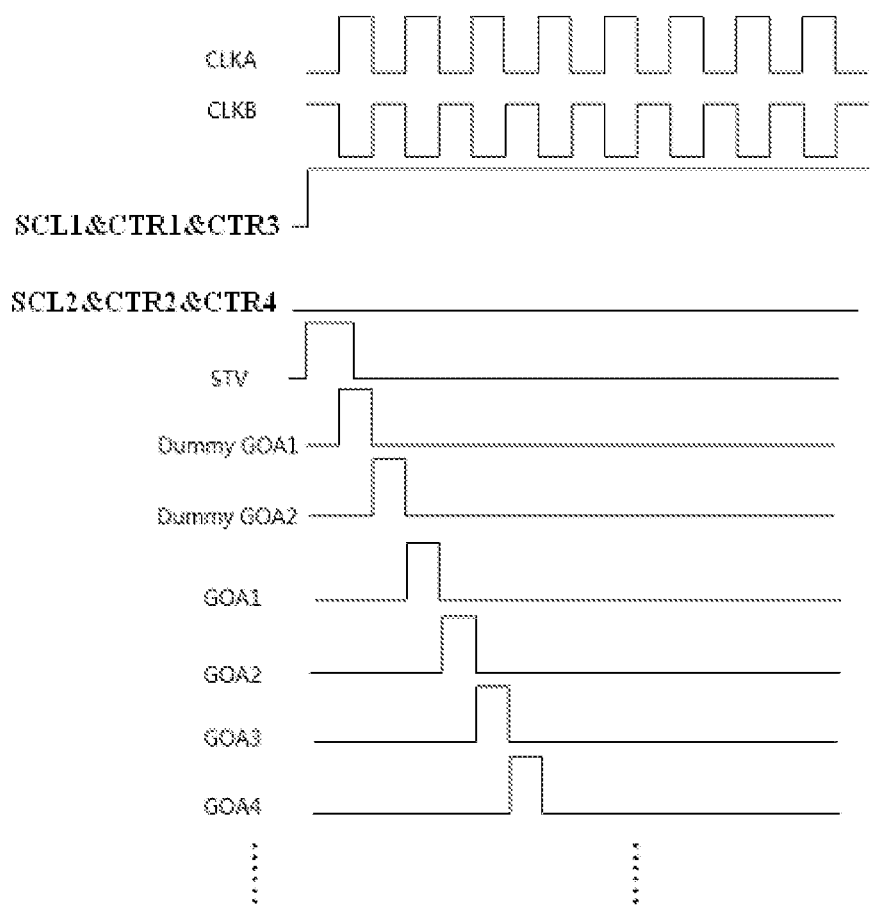
FIG. 5 illustrates a signal timing adopted when the gate driving circuit illustrated in FIG. 4 performs 2D display driving according to an embodiment of the present disclosure.

When the display panel performs 2D displaying in a 2D mode, as illustrated in FIG. 5, the first switching control line SCL1 provides a high voltage level, the second switching control line SCL2 provides a low voltage level, the first control line CTR1 and the third control line CTR3 provide a high voltage level, and the second control line CTR2 and the fourth control line CTR4 provide a low voltage level.

Since the control electrodes of the switching transistors disposed between GOA units in two stages that are immediately adjacent are connected to the first switching control line SCL1, the switching transistors disposed between GOA units in two stages that are immediately adjacent are turned on, so that a signal path of GOA units in two stages that are immediately adjacent is switched on; specifically, the output signal of Dummy GOA 1 can be provided to the signal input terminal of Dummy GOA 2 via the turned-on switching transistor SW1, and the output signal of Dummy GOA 2 can be provided to the reset terminal of Dummy GOA 1 via the turned-on switching transistor SW3; similarly, the output signal of Dummy GOA 2 can be provided to the signal input terminal of Scanning GOA 1 in the first stage via the turned-on switching transistor SW6, and the output signal of Scanning GOA 1 in the first stage can be directly provided to the reset terminal of Dummy GOA 2; and the output signal of Scanning GOA 1 in the first stage can also be provided to the signal input terminal of Scanning GOA 2 in the second stage via the turned-on switching transistor SW8, and the output signal of Scanning GOA 2 in the second stage can be provided to the reset terminal of Scanning GOA 1 in the first stage via the turned-on switching transistor SW10; moreover, since the control electrodes of the switching transistors disposed between two stages GOA units that are spaced by one stage are connected to the second switching control line SCL2, a signal path of two stages of GOA units that are spaced by one stage is cut off; specifically, since the switching transistor SW2 is turned off, the signal path between the signal output terminal of Dummy GOA 1 and the signal input terminal of Scanning GOA 1 in the first stage is cut off; since the switching transistor SW4 is turned off, the signal path between the reset terminal of Dummy GOA 1 and the signal output terminal of Scanning GOA 1 in the first stage is cut off; similarly, since the switching transistor SW7 is turned off, the signal path between the signal output terminal of Dummy GOA 2 and the signal input terminal of Scanning GOA 2 in the second stage is cut off; since the switching transistor SW9 is turned off, the signal path between the signal output terminal of Scanning GOA 1 in the first stage and the signal input terminal of Scanning GOA 3 in the third stage is cut off; since the switching transistor SW11 is turned off, the signal path between the reset terminal of Scanning GOA 1 in the first stage and the signal output terminal of Scanning GOA 3 in the third stage is cut off; signal connection relationships of the GOA units in the rest stages can be analogized.

In addition, since the second switching control line SCL2 provides a low voltage level, the switching transistor SW5 whose control electrode is connected to the second switching control line SCL2 is turned off; that is, the signal path between the signal input terminal of Dummy GOA 2 and the STV signal is cut off.

As can be seen, in the 2D display mode, for example, in a forward scanning mode, when an STV signal is inputted, the scanning GOA units in respective stages are triggered by the output signal of the GOA unit in a previous stage, so as to drive the corresponding gate lines, and the output signal of the GOA units in respective stages are provided as a reset signal to the GOA unit in a previous stage. As for the operating principle of the GOA units in respective stages, reference can be made to the operating principle of the shift register unit described above with reference to FIGS. 2 and 3, details are not repeated herein.

In addition, since the first control terminal of the clock signal selection sub-circuit in Dummy GOA 1 is connected to the first control line CTRL and the second control terminal thereof is connected to the second control line CTR2, the clock signal selection sub-circuit selects the first clock signal CLKA to output the same at its first output terminal and selects the second clock signal CLKB to output the same at its second output terminal.

Similarly, since the first control terminal of the clock signal selection sub-circuit in Dummy GOA 2 is connected to the third control line CTR3 and the second control terminal thereof is connected to the fourth control line CTR4, the clock signal selection sub-circuit therein selects the second clock signal CLKB to output the same at its first output terminal and selects the first clock signal CLKA to output the same at its second output terminal.

Similarly, since the first control terminal of the clock signal selection sub-circuit in Scanning GOA 1 in the first stage is connected to the third control line CTR3 and the second control terminal thereof is connected to the fourth control line CTR4, the clock signal selection sub-circuit therein selects the first clock signal CLKA to output the same at its first output terminal and selects the second clock signal CLKB to output the same at its second output terminal.

Similarly, since the first control terminal of Scanning GOA 2 in the second stage is connected to the first control line CTR1 and the second control terminal thereof is connected to the second control line CTR2, the clock signal selection sub-circuit thereof selects the second clock signal CLKB to output the same at its first output terminal and selects the first clock signal CLKA to output the same at its second output thereof.

The clock signals selected by the clock signal selection circuits of Scanning GOAs in the other respective stages can be analogized, and reference can be made to the timing of output signals of GOA units in respective stages as schematically illustrated in FIG. 5.

When the display mode of the display panel is switched to 3D, the dual gate lines need to be turned on simultaneously. The operating principle of the gate driving circuit in performing 3D display driving according to an embodiment of the present disclosure will be described below with reference to signal timing schematically illustrated in FIG. 6.

Figure 6:
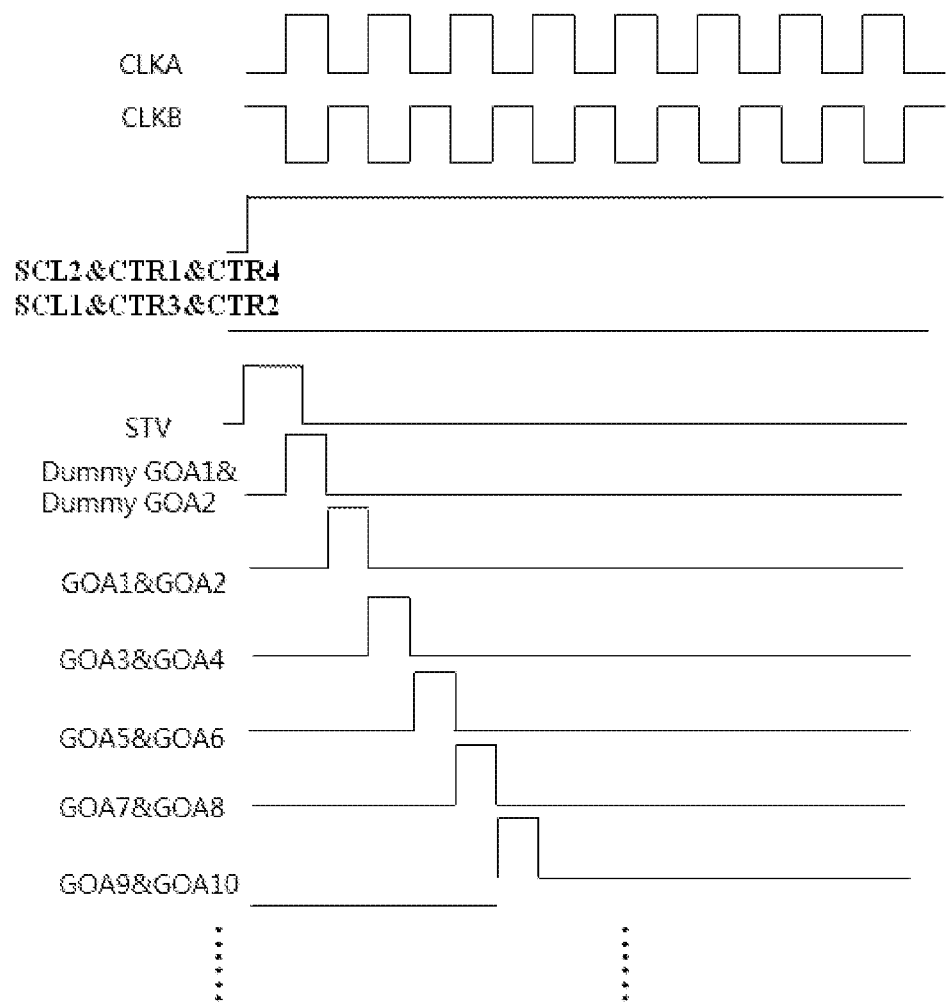
FIG. 6 illustrates a signal timing adopted when the gate driving circuit illustrated in FIG. 4 performs 3D display driving according to an embodiment of the present disclosure.

When the display panel is switched to the 3D mode for 3D displaying, as illustrated in FIG. 6, the first switching control line SCL1 provides a low voltage level, the second switching control line SCL2 provides a high voltage level, the first control line CTR1 and the fourth control line CTR4 provide a high voltage level, and the second control line CTR2 and the third control line CTR3 provide a low voltage level.

Since the control electrodes of the switching transistors disposed between GOA units in two stages that are immediately adjacent are connected to the first switching control line SCL1, the switching transistors disposed between GOA units in two stages that are immediately adjacent are turned off, so that the signal path between GOA units in two stages that are immediately adjacent via the switching transistor is cut off; specifically, the signal path between the signal output terminal of Dummy GOA 1 and the signal input terminal of Dummy GOA 2 is cut off, and the signal path between the signal output terminal of Dummy GOA 2 and the reset terminal of Dummy GOA 1 is cut off; similarly, the signal path between the signal output terminal of Dummy GOA 2 and the signal input terminal of Scanning GOA 1 in the first stage is cut off, and the output signal of Scanning GOA 1 in the first stage can be directly provided to the reset terminal of Dummy GOA 2; the signal path between the signal output terminal of Scanning GOA 1 in the first stage and the signal input terminal of Scanning GOA 2 in the second stage is cut off, and the signal path between the signal output terminal of Scanning GOA 2 in the second stage and the reset terminal of Scanning GOA 1 in the first stage is cut off.

In addition, since the control electrodes of the switching transistors disposed between GOA units in two stages that are spaced by one stage are connected to the second switching control line SCL2, said switching transistors are turned on, and thereby the signal path between GOA units in two stages that are spaced by one stage is switched on. Specifically, since the switching transistor SW2 is turned on, the signal path between the signal output terminal of Dummy GOA 1 and the signal input terminal of Scanning GOA 1 in the first stage is switched on; since the switching transistor SW4 is turned on, the signal path between the reset terminal of Dummy GOA 1 is turned on and the signal output terminal of Scanning GOA 1 in the first stage is switched on; similarly, since the switching transistor SW7 is turned on, the signal path between the signal output terminal of Dummy GOA 2 and the signal input terminal of Scanning GOA 2 in the second stage is switched on; since the switching transistor SW9 is turned on, the signal path between the signal output terminal of Scanning GOA 1 in the first stage and the signal input terminal of Scanning GOA 3 in the third stage is switched on; since the switching transistor SW11 is turned on, the signal path between the reset terminal of Scanning GOA 1 in the first stage and the signal output terminal of Scanning GOA 3 in the third stage is switched on; signal connection relationships of the GOA units in the rest stages can be analogized.

In addition, since the second switching control line SCL2 provides a high voltage level, the switching transistor SW5 whose control electrode is connected to the second switching control line SCL2 is turned on; that is, the signal path between the signal input terminal of Dummy GOA 2 and the STV signal is switched on.

As can be seen, in the 3D display mode, Dummy GOA 1 and Dummy GOA 2 are connected in parallel via the input signal terminals and the reset signal terminals, respectively, and the signals outputted from Dummy GOA 1 and Dummy GOA 2 serve as the input signals of Scanning GOA 1 in the first stage and Scanning GOA 2 in the second stage, respectively; the reset terminals of Scanning GOA 1 in the first stage and Scanning GOA 2 in the second stage are both connected with the signal output terminal of Scanning GOA 3 in the third stage, and the signals outputted by Scanning GOA 1 in the first stage and Scanning GOA 2 in the second stage are configured to not only drive the corresponding gate lines, but also serve as the input signals of Scanning GOA 3 in the third stage and Scanning GOA 4 in the fourth stage, respectively; signal connection relationships of subsequent Scanning GOAs can be analogized. As for the operating principle of the GOA units in various stages, reference can be made to the operating principle of the shift register unit described above with reference to FIGS. 2 and 3, and details are not repeated herein.

Therefore, in the 3D display mode, for example, in a forward scanning mode, when the STV signal is inputted, the signal input terminals of Dummy GOA 1 and Dummy GOA 2 both receive the STV signal as the trigger signal, and their reset terminals both receive the output signal of Scanning GOA 1 in the first stage as the reset signal; thus, as illustrated in FIG. 6, timings of the signals outputted by Dummy GOA 1 and Dummy GOA 2 are the same; as described above, since Scanning GOA 1 in the first stage and Scanning GOA 2 in the second stage receive the outputs signals from Dummy GOA 1 and Dummy GOA 2 as the trigger signal respectively, and their reset terminals both receive the output signal from Scanning GOA 3 in the third stage as the reset signal; therefore, as illustrated in FIG. 6, timings of signals outputted by Scanning GOA 1 in the first stage and Scanning GOA 2 in the second stage are the same; that is, the gate line corresponding to Scanning GOA 1 in the first stage and the gate line corresponding to Scanning GOA 2 in the second stage are simultaneously turned on; similarly, timings of the signals outputted by Scanning GOA 3 in the third stage and Scanning GOA 4 in the fourth stages are the same, and the gate lines corresponding to them are simultaneously turned on; timings of the rest Scanning GOAs can be analogized, and accordingly, the dual gate lines can be simultaneously turned on.

As described above, the first control line CTR1 and the fourth control line CTR4 provide a high voltage level, whereas the second control line CTR2 and the third control line CTR3 provide a low voltage level; since the first control terminal of the clock signal selection sub-circuit in Dummy GOA 1 is connected to the first control line CTR1 and the second control terminal thereof is connected to the second control line CTR2, the clock signal selection sub-circuit therein selects the first clock signal CLKA to output the same at its first output terminal and selects the second clock signal CLKB to output the same at its second output terminal.

Similarly, since the first control terminal of the clock signal selection sub-circuit in Dummy GOA 2 is connected to the third control line CTR3 and the second control terminal thereof is connected to the fourth control line CTR4, the clock signal selection sub-circuit therein selects the first clock signal CLKA to output the same at its first output terminal and selects the second clock signal CLKB to output the same at its second output terminal.

As can be seen, timings of the clock signals of Dummy GOA 1 and Dummy GOA 2 are the same.

Similarly, since the first control terminal of the clock signal selection sub-circuit in Scanning GOA 1 in the first stage is connected to the third control line CTR3 and the second control terminal thereof is connected to the fourth control line CTR4, the clock signal selection sub-circuit therein selects the second clock signal CLKB to output the same at its first output terminal and the first clock signal CLKA to output the same at its second output terminal.

Similarly, since the first control terminal of Scanning GOA 2 in the second stage is connected to the first control line CTR1 and the second control terminal thereof is connected to the second control line CTR2, the clock signal selection sub-circuit thereof selects the second clock signal CLKB to output the same at its first output terminal and selects the first clock signal CLKA to output the same at its second output terminal.

As can be seen, timings of the clock signals of Scanning GOA 1 in the first stage and Scanning GOA 2 in the second stages are also the same.

Clock signals selected by the clock signal selection sub-circuits in Scanning GOA in the rest stages can be analogized. Reference can be made to the timings of output signals of GOA units in respective stages as schematically illustrated in FIG. 6

As can be seen, in the 3D display mode, for example, in a forward scanning mode, when an STV signal is inputted, timings of the input signals, the clock signals, and the reset signals in Scanning GOA units in two consecutive stages, for example, GOA 1 & GOA 2, GOA 3 & GOA 4, GOA 5 & GOA 6 ... GOA 2N+1 & GOA 2N+2, are exactly the same respectively, so that the same signal is outputted to the corresponding two gate lines, and dual gates are turned on simultaneously. FIG. 6 schematically illustrates a timing diagram of the entire display panel, wherein the normal 3D display of the display panel is completed when the frame rate is reduced; as for the operating principle of GOA units in respective stages, reference can be made to the description provided above with reference to the operating principle of the shift register unit described above with reference to FIGS. 2 and 3, without repeating the details herein.

Figure 7:
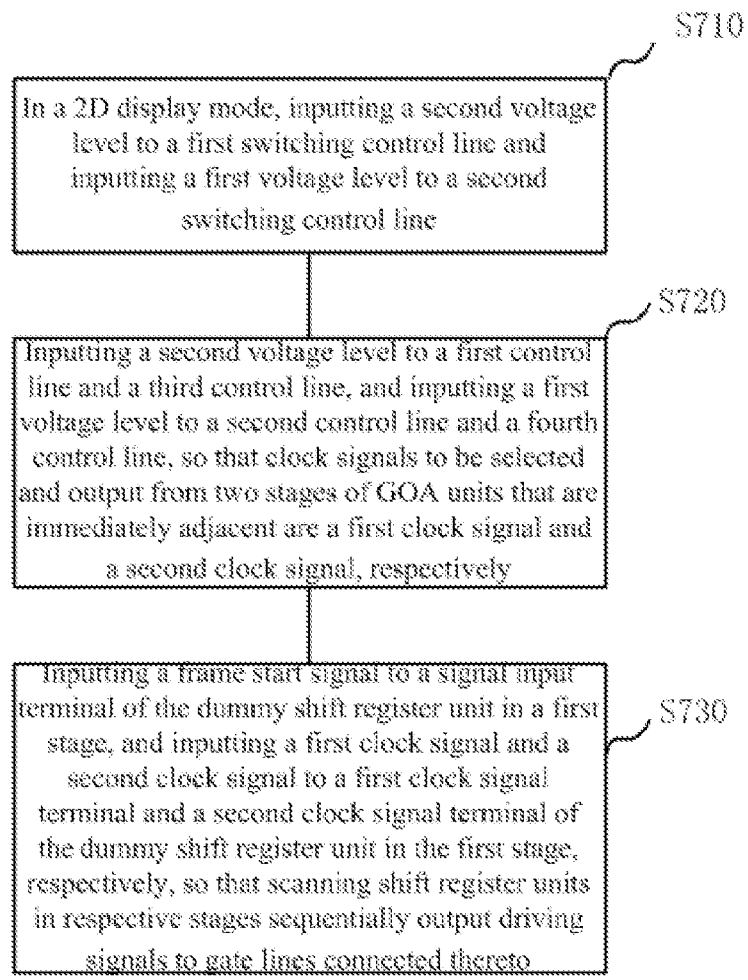
FIG. 7 illustrates a schematic flowchart of a method applied to the gate driving circuit illustrated in FIG. 4 according to an embodiment of the present disclosure.

According to still another aspect of the present disclosure, there is also provided a method for controlling the gate driving circuit illustrated in FIG. 4. As illustrated in FIG. 7, the method mainly comprises: in a 2D display mode, inputting a second voltage level to a first switching control line and inputting a first voltage level to a second switching control line, thereby turning on a first switching transistor disposed between two stages of GOA units that are immediately adjacent and turning off a second switching transistor disposed between two stages of GOA units that are spaced by one stage; inputting a second voltage level to a first control line and a third control line, and inputting a first voltage level to a second control line and a fourth control line, so that clock signals to be selected and output by two stages of GOA units that are immediately adjacent are a first clock signal and a second clock signal, respectively; inputting a frame start signal to a signal input terminal of the dummy shift register unit in a first stage, and inputting a first clock signal and a second clock signal to a first clock signal terminal and a second clock signal terminal of the dummy shift register unit in the first stage, respectively, so that scanning shift register units in respective stages sequentially output driving signals to gate lines connected thereto, wherein when the shift register in m-th stage is concerned, a signal output from the shift register in an (m−1)-th stage is received at a signal input terminal of the shift register in the m-th stage, a trigger signal is outputted at a signal output terminal of the shift register in an m-th stage to the shift register in an (m+1)-th stage, and a signal output from the shift register in the (m+1)-th stage is received as a reset signal at a reset terminal of the shift register in the m-th stage. Optionally, the first voltage level is a low voltage level, and the second voltage level is a high voltage level.

Figure 8:
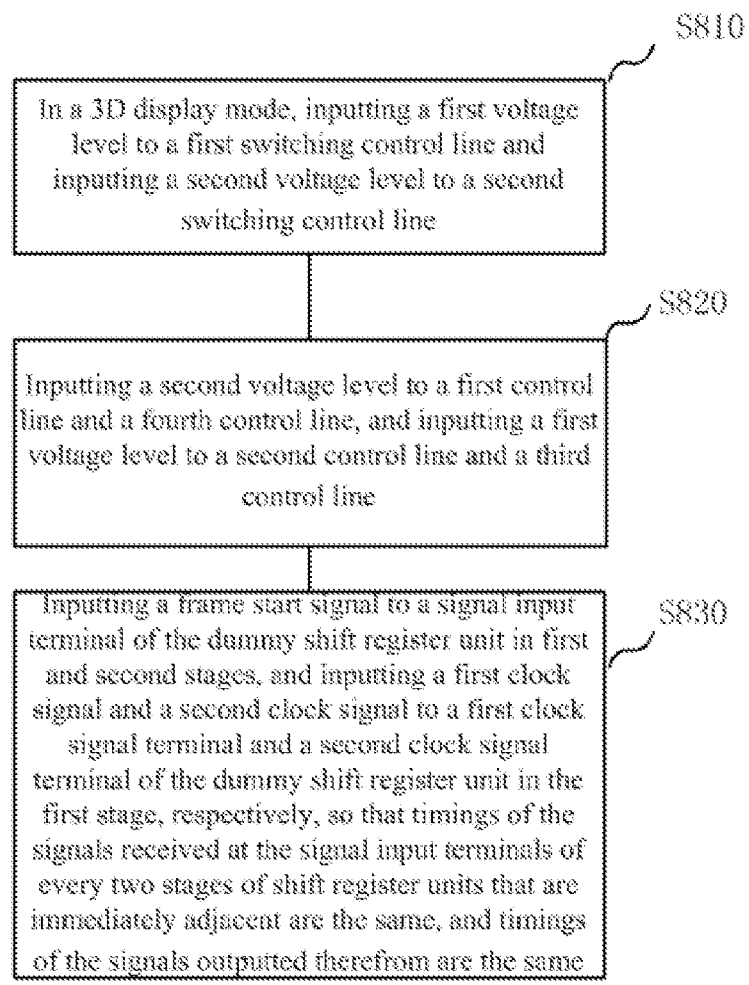
FIG. 8 illustrates a schematic flowchart of another method applied to the gate driving circuit illustrated in FIG. 4 according to an embodiment of the present disclosure.

Optionally, as illustrated in FIG. 8, the above method further comprises: in a 3D display mode, inputting a first voltage level to a first switching control line and inputting a second voltage level to a second switching control line, thereby turning off a first switching transistor disposed between two stages of GOA units that are immediately adjacent and turning on a second switching transistor disposed between two stages of GOA units that are spaced by one stage; inputting a second voltage level to a first control line and a fourth control line, and inputting a first voltage level to a second control line and a third control line, so that clock signals to be selected and output by every two stages of GOA units that are immediately adjacent are the same, i.e., being one of a first clock signal and a second clock signal, and the clock signal to be selected and output by two stages of GOA units subsequent thereto is the other one of the first clock signal and the second clock signal; inputting a frame start signal to a signal input terminal of the dummy shift register unit in first and second stages, and inputting a first clock signal and a second clock signal to a first clock signal terminal and a second clock signal terminal of the dummy shift register unit in the first stage, respectively, so that timings of the signals received at the signal input terminal of every two stages of shift register units that are immediately adjacent are the same, and timings of the signals outputted therefrom are the same. Optionally, the first voltage level is a low voltage level, and the second voltage level is a high voltage level.

In the shift register unit, the gate driving circuit and the driving method thereof provided according to the present disclosure, switching transistors are disposed between shift register units in respective stages, and the respective switching transistors are controlled by corresponding control lines, so that connection manners of the shift register units in respective stages can be changed between the 2D display mode and the 3D display mode, and thereby the display panel can switch freely between two different display modes of 2D and 3D, and dual gate lines can be scanned simultaneously during the 3D display, reducing the scanning frequency, decreasing the impact caused by high-frequency scanning signals on charging of the display panel, and without additional design, reducing the product cost significantly.

The above described merely are specific implementations of the present disclosure, but the protection scope of the present disclosure is not limited thereto, modification and replacements easily conceivable for those skilled in the art within the technical range revealed by the present disclosure all fall into the protection scope of the present disclosure. Therefore, the protection scope of the present disclosure is based on the protection scope of the claims.

The present application claims priority of the Chinese Patent Application No. 201710237626.8 filed on Apr. 12, 2017, the entire disclosure of which is hereby incorporated in full text by reference as part of the present application.

What is claimed is:

1. A gate driving circuit, comprising N stages of a shift register unit, wherein the shift register unit comprises:
   an input sub-circuit connected between a signal input terminal and a pull-up node, and configured to input a signal to the pull-up node,
   an output sub-circuit connected between the pull-up node and a signal output terminal, and configured to output a pulse signal to the signal output terminal under control of the pull-up node;
   a reset sub-circuit connected between a reset terminal, the pull-up node, and the signal output terminal, and configured to reset the pull-up node and the signal output terminal under control of the reset terminal; and
   a clock signal selection sub-circuit having input terminals connected to a first clock signal terminal and a second clock signal terminal, control terminals connected to a first control terminal and a second control terminal, and a first output terminal connected to the output sub-circuit, and configured to select to provide either a first clock signal or a second clock signal to the output sub-circuit according to voltage levels at the first control terminal and the second control terminal, as an input clock signal to the output sub-circuit,
   wherein the input clock signal is the same as one of the first clock signal and the second clock signal in a case where the voltage levels at the first control terminal and the second control terminal are opposite,
   wherein a shift register unit in a k-th stage is configured to scan a corresponding gate line, and a signal output terminal of the shift register unit in the k-th stage is connected to a signal input terminal of the shift register unit in an (k+1)-th stage via a first switching transistor corresponding to the k-th stage and further connected to a signal input terminal of the shift register unit in a (k+2)-th stage via a second switching transistor corresponding to the k-th stage, where k≥3, N and k are integers, and
   a signal input terminal of the shift register unit in the k-th stage is connected to a signal output terminal of the shift register unit in a (k−1)-th stage via a third switching transistor corresponding to the k-th stage and further connected to an output terminal of the shift register unit in a (k−2)-th stage via a fourth switching transistor corresponding to the k-th stage.

2. The gate driving circuit according to claim 1, wherein the shift register unit in a first stage and the shift register unit in a second stage are configured as dummy shift register units;
   a signal output terminal of the shift register unit in the first stage is connected to a signal input terminal of the shift register unit in the second stage via the first switching transistor corresponding to the first stage, and a signal input terminal of the shift register unit in the first stage is configured to receive a frame start signal STV; and
   the signal input terminal of the shift register unit in the second stage is further configured to receive the frame start signal STV via the second switching transistor corresponding to the second stage.

3. The gate driving circuit according to claim 1, wherein a reset terminal of the shift register unit in a (2j−1)-th stage is connected to a signal output terminal of a stage shift register unit in a 2j-th stage via a fifth switching transistor corresponding to the (2j−1)-th stage and further connected to a signal output terminal of the shift register unit in a (2j+1)-th stage via a sixth switching transistor corresponding to the (2j−1)-th stage; and
   a reset terminal of the shift register unit in a 2j-th stage is connected to a signal output terminal of the shift register unit in the (2j+1)-th stage, where 1≤j≤(N−1)/2, and j is an integer.

4. A driving method applied to the gate driving circuit according to claim 1, comprising:
   in a 2D display mode, inputting a second voltage level to a first switching control line and inputting a first voltage level to a second switching control line, thereby turning on a first switching transistor disposed between two stages of GOA units that are immediately adjacent and turning off a second switching transistor disposed between two stages of GOA units that are spaced by one stage;
   inputting the second voltage level to a first control line and a third control line, and inputting the first voltage level to a second control line and a fourth control line, so that clock signals to be selected and output by two stages of GOA units that are immediately adjacent are a first clock signal and a second clock signal; and
   inputting a frame start signal to a signal input terminal of a dummy shift register unit in a first stage, and inputting the first clock signal and a second clock signal to the first clock signal terminal and the second clock signal terminal of the dummy shift register unit in the first stage, respectively, so that scanning shift register units in respective stages sequentially output driving signals to gate lines connected thereto.

5. The driving method according to claim 4, further comprising:
   in a 3D display mode, inputting the first voltage level to the first switching control line and inputting the second voltage level to the second switching control line, thereby turning off the first switching transistor disposed between two stages of GOA units that are immediately adjacent and turning on the second switching transistor disposed between two stages of GOA units that are spaced by one stage;
   inputting the second voltage level to the first control line and the fourth control line, and inputting the first voltage level to the second control line and the third control line, so that clock signals to be selected and output by every two stages of GOA units that are immediately adjacent are the same, being one of a first clock signal and a second clock signal, and the clock signal to be selected and output by two stages of GOA units subsequent thereto is the other one of the first clock signal and the second clock signal; and
   inputting the frame start signal to a signal input terminal of the dummy shift register unit in first and second stages, and inputting the first clock signal and the second clock signal to the first clock signal terminal and the second clock signal terminal of the dummy shift register unit in the first stage, respectively, so that timings of the signals received at the signal input terminals of every two stages of shift register units that are immediately adjacent are the same, and timings of the signals outputted therefrom are the same.

6. The gate driving circuit according to claim 1, wherein the shift register unit further comprises:
   a pull-down node control sub-circuit connected to the pull-up node and a second output terminal of the clock signal selection sub-circuit, and configured to control a voltage level at a pull-down node according to the first clock signal or the second clock signal provided by the clock signal selection sub-circuit and the voltage level at the pull-up node; and a pull-down sub-circuit connected to the pull-down node, the pull-up node, and the signal output terminal, and configured to pull down the pull-up node and the signal output terminal according to the voltage level at the pull-down node.

7. The gate driving circuit according to claim 1, wherein the shift register unit further comprises:

an auxiliary control sub-circuit connected to the pull-up node, the signal output terminal, and a second output terminal of the clock signal selection sub-circuit, and configured to assist in controlling voltage levels at the pull-up node and the signal output terminal according to a clock signal provided by the clock signal selection sub-circuit.

8. The gate driving circuit according to claim 1, wherein, the input sub-circuit comprises: an input transistor having a control electrode and a first electrode connected to the signal input terminal, and a second electrode connected to the pull-up node;

the output sub-circuit comprises: an output transistor having a control electrode connected to the pull-up node, a first electrode connected to the first output terminal of the clock signal selection sub-circuit, and a second electrode connected to the signal output terminal; and a capacitor having a first terminal connected to the pull-up node, and a second terminal connected to the signal output terminal; and the reset sub-circuit comprises: a first reset transistor having a control electrode connected to the reset terminal, a first electrode connected to the pull-up node, and a second electrode connected to a first power supply terminal; and a second reset transistor having a control electrode connected to the reset terminal, a first electrode connected to the signal output terminal, and a second electrode connected to the first power supply terminal.

9. The gate driving circuit according to claim 1, wherein the clock signal selection sub-circuit comprises: a first selection transistor having a control electrode connected to the first control terminal, a first electrode connected to the first clock signal terminal, and a second electrode connected to the first output terminal of the clock signal selection sub-circuit; and a second selection transistor having a control electrode connected to the second control terminal, a first electrode connected to the second clock signal terminal, and a second electrode connected to the first output terminal of the clock signal selection sub-circuit.

10. The gate driving circuit according to claim 9, wherein the clock signal selection sub-circuit further comprises: a third selection transistor having a control electrode connected to the first control terminal, a first electrode connected to the second clock signal terminal, and a second electrode connected to a second output terminal of the clock signal selection sub-circuit; and a fourth selection transistor having a control electrode connected to the second control terminal, a first electrode connected to the first clock signal terminal, and a second electrode connected to the second electrode of the third selection transistor.

11. The gate driving circuit according to claim 6, wherein the pull-down node control sub-circuit comprises: a first pull-down control transistor having a control electrode and a first electrode connected to the second output terminal of the clock signal selection sub-circuit, and a second electrode connected to a pull-down control node; a second pull-down control transistor having a control electrode connected to the pull-down control node, a first electrode connected to the first electrode of the first pull-down control transistor, and a second electrode connected to the pull-down node; and a third pull-down control transistor having a control electrode connected to the pull-up node, a first electrode connected to the pull-down control node, and a second electrode connected to a first power supply terminal; and a fourth pull-down control transistor having a control electrode connected to the pull-up node, a first electrode connected to the pull-down node, and a second electrode connected to the first power supply terminal.

12. The gate driving circuit according to claim 6, wherein the pull-down sub-circuit comprises: a first pull-down transistor having a control electrode connected to the pull-down node, a first electrode connected to the pull-up node, and a second electrode connected to a first power supply terminal; and a second pull-down transistor having a control electrode connected to the pull-down node, a first electrode connected to the signal output terminal, and a second electrode connected to the first power supply terminal.

13. The gate driving circuit according to claim 7, wherein the auxiliary control sub-circuit comprises:

a first auxiliary control transistor having a control electrode connected to the second output terminal of the clock signal selection sub-circuit, a first electrode connected to the signal input terminal, and a second electrode connected to the pull-up node; and a second auxiliary control transistor having a control electrode connected to the second output terminal of the clock signal selection sub-circuit, a first electrode connected to the signal output terminal, and a second electrode connected to a first power supply terminal.

14. The gate driving circuit according to claim 6, wherein the shift register unit further comprises:

an auxiliary control sub-circuit connected to the pull-up node, the signal output terminal, and a second output terminal of the clock signal selection sub-circuit, and configured to assist in controlling voltage levels at the pull-up node and the signal output terminal according to a clock signal provided by the clock signal selection sub-circuit.

15. The gate driving circuit according to claim 14, wherein the clock signal selection sub-circuit comprises: a first selection transistor having a control electrode connected to the first control terminal, a first electrode connected to the first clock signal terminal, and a second electrode connected to the first output terminal of the clock signal selection sub-circuit; and a second selection transistor having a control electrode connected to the second control terminal, a first electrode connected to the second clock signal terminal, and a second electrode connected to the first output terminal of the clock signal selection sub-circuit.

16. The gate driving circuit according to claim 15, wherein the clock signal selection sub-circuit further comprises: a third selection transistor having a control electrode connected to the first control terminal, a first electrode connected to the second clock signal terminal, and a second electrode connected to a second output terminal of the clock signal selection sub-circuit; and a fourth selection transistor having a control electrode connected to the second control terminal, a first electrode connected to the first clock signal terminal, and a second electrode connected to the second electrode of the third selection transistor.

17. The gate driving circuit according to claim 14, wherein the auxiliary control sub-circuit comprises:
  a first auxiliary control transistor having a control electrode connected to the second output terminal of the clock signal selection sub-circuit, a first electrode connected to the signal input terminal, and a second electrode connected to the pull-up node; and
  a second auxiliary control transistor having a control electrode connected to the second output terminal of the clock signal selection sub-circuit, a first electrode connected to the signal output terminal, and a second electrode connected to a first power supply terminal.

* * * * *